(12) United States Patent
Eckhart

(10) Patent No.: US 10,330,256 B2
(45) Date of Patent: Jun. 25, 2019

(54) COLUMN GRIP

(71) Applicant: Douglas Michael Eckhart, Hillsborough, NJ (US)

(72) Inventor: Douglas Michael Eckhart, Hillsborough, NJ (US)

(*) Notice: Subject to any disclaimer, the term of this patent is extended or adjusted under 35 U.S.C. 154(b) by 0 days.

(21) Appl. No.: 15/835,402

(22) Filed: Dec. 7, 2017

(65) Prior Publication Data

US 2018/0163919 A1    Jun. 14, 2018

Related U.S. Application Data

(60) Provisional application No. 62/431,732, filed on Dec. 8, 2016.

(51) Int. Cl.
| | |
|---|---|
| *A01M 99/00* | (2006.01) |
| *F16M 13/02* | (2006.01) |
| *F16B 2/04* | (2006.01) |
| *A47B 96/06* | (2006.01) |
| *A47B 5/02* | (2006.01) |
| *B25H 3/00* | (2006.01) |
| *A47G 29/00* | (2006.01) |
| *F21V 21/08* | (2006.01) |
| *G09F 17/00* | (2006.01) |

(Continued)

(52) U.S. Cl.
CPC .......... *F16M 13/022* (2013.01); *A01M 99/00* (2013.01); *A47B 5/02* (2013.01); *A47B 95/008* (2013.01); *A47B 96/06* (2013.01); *A47G 7/044* (2013.01); *A47G 29/00* (2013.01); *B25H 3/00* (2013.01); *B25H 3/04* (2013.01); *F16B 2/04* (2013.01); *F21V 21/08* (2013.01); *G09F 17/00* (2013.01); *F16B 2/005* (2013.01); *F16B 2/18* (2013.01); *H05K 5/0204* (2013.01)

(58) Field of Classification Search
CPC . F16M 13/022; F16B 2/04; F16B 2/18; F16B 2/005; A47B 96/06; A47B 5/02; B25H 3/00; A01M 99/00; A47G 29/00; A47G 7/044; F21V 21/08; G09F 17/00; H05K 5/0204

See application file for complete search history.

(56) References Cited

U.S. PATENT DOCUMENTS

| | | |
|---|---|---|
| 3,650,173 A | 3/1972 | Mathe |
| 3,891,172 A | 6/1975 | Einhorn |

(Continued)

*Primary Examiner* — Daniel A Hess
(74) *Attorney, Agent, or Firm* — Michael Huey

(57) ABSTRACT

A column grip that supports objects by friction grip to smooth surfaces, particularly columns on a railing system. The column grip comprises a cam assembly that actuates about a main axis to fit between columns located on deck, stairway or hallway railing. A compression spring provides a driving force to secure outer surfaces of the invention against the columns. When supporting heavy objects, its parrot beak design provides mechanical advantage proportionate to an objects weight, by pushing its outer surfaces harder against opposing columns and creating additional friction against opposing columns. A broad range of accessories, including a shelf, hook, gardening accessories, deck light, light sources, decoration, flag holder, and the like attaches to the embodiment. For example, a deck light attached to this invention that not only improve the aesthetic appeal of a deck, but also illuminates its surrounding area and enhance safety.

23 Claims, 24 Drawing Sheets

(51) Int. Cl.
  *A47G 7/04*   (2006.01)
  *A47B 95/00*  (2006.01)
  *B25H 3/04*   (2006.01)
  *F16B 2/18*   (2006.01)
  *F16B 2/00*   (2006.01)
  *H05K 5/02*   (2006.01)

(56) References Cited

U.S. PATENT DOCUMENTS

| | | |
|---|---|---|
| 3,948,485 A | 4/1976 | Chouinard et al. |
| 3,952,436 A | 4/1976 | Kuhnke |
| 4,082,241 A | 4/1978 | Burkey |
| 4,184,657 A | 1/1980 | Jardine |
| 4,360,991 A | 11/1982 | West |
| 4,405,108 A | 9/1983 | Muirhead |
| 4,491,291 A | 1/1985 | Ching |
| 4,531,697 A | 7/1985 | Steiner et al. |
| 4,565,342 A | 1/1986 | Grow |
| 4,610,587 A | 9/1986 | Wollar et al. |
| 4,681,232 A | 7/1987 | Du Corday |
| 4,712,754 A | 12/1987 | Brodie |
| 4,832,289 A | 5/1989 | Waggoner |
| 5,207,335 A | 5/1993 | Voelz |
| 5,680,938 A | 10/1997 | Rubinstein |
| 5,860,629 A | 1/1999 | Reed |
| 5,899,343 A | 5/1999 | Franklin et al. |
| 6,053,280 A | 4/2000 | Smith et al. |
| 6,484,893 B1 | 11/2002 | Tkatch |
| 6,679,466 B2 | 1/2004 | Brown |
| 7,204,372 B2 | 4/2007 | Kin et al. |
| 7,959,119 B2 | 6/2011 | Tusting et al. |
| 8,011,080 B2 | 9/2011 | Brown et al. |
| 8,011,148 B2 | 9/2011 | Bertke et al. |
| 8,117,798 B2 | 2/2012 | Bergman |
| 8,317,145 B2 | 11/2012 | Reed |
| 8,439,211 B2 | 5/2013 | Emrani et al. |
| 8,770,531 B2 | 7/2014 | Cundy |
| 8,967,575 B1 | 3/2015 | Gretz |
| 9,010,550 B2 | 4/2015 | Figueroa |
| 9,127,698 B1 | 9/2015 | Brull et al. |
| 9,410,568 B2 | 8/2016 | O'Brien |
| 2018/0001175 A1* | 1/2018 | Davidson ............. A63B 29/024 |

* cited by examiner

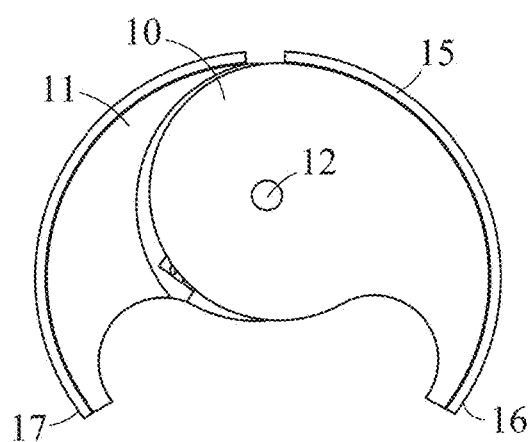
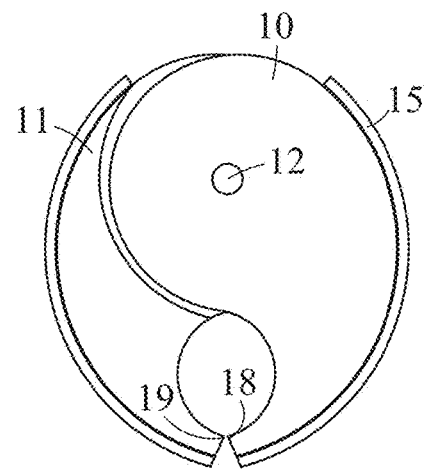
FIG. 5　　　　　　　FIG. 6
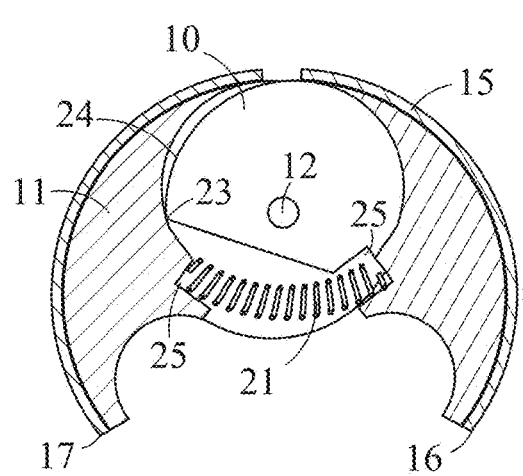
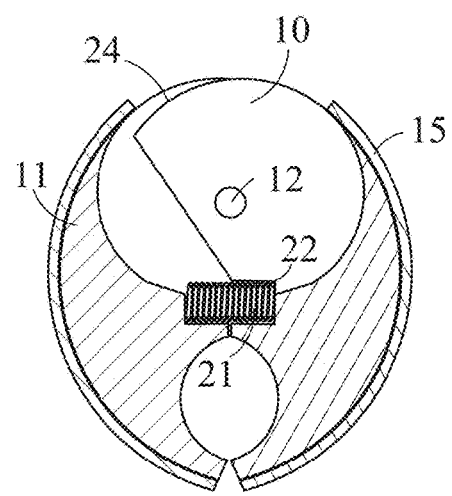
FIG. 7　　　　　　　FIG. 8

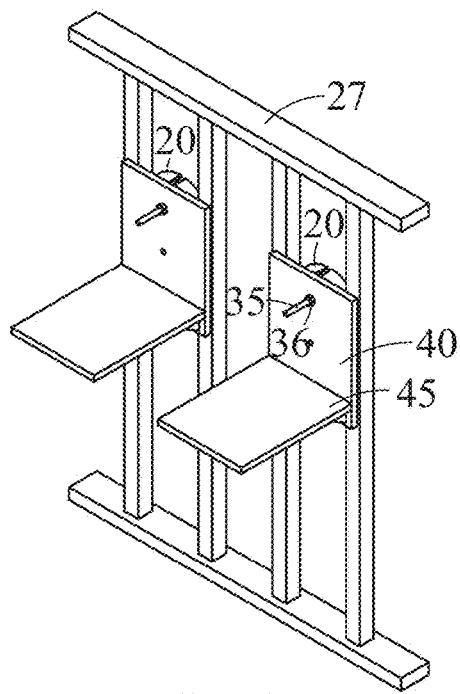
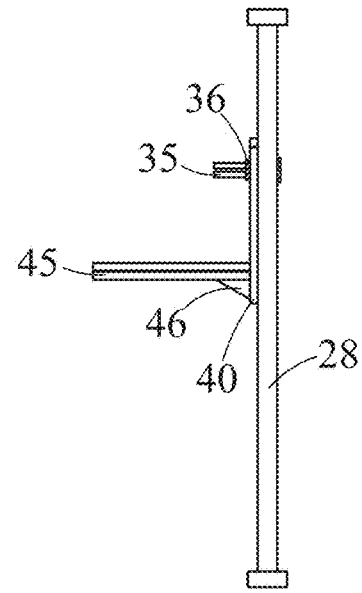
FIG. 22  FIG. 23
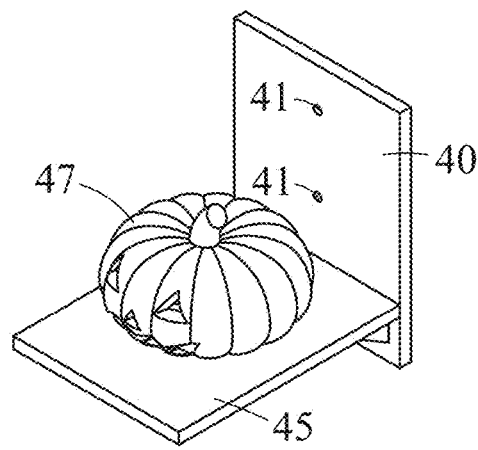
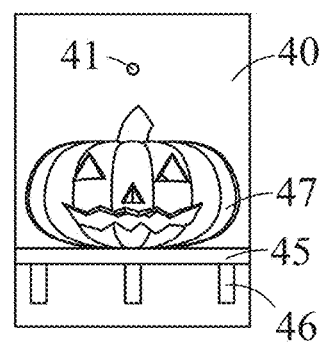
FIG. 24  FIG. 25

COLUMN GRIP

CROSS REFERENCE TO RELATED APPLICATION

This application is related to, and claims priority from U.S. Provisional Patent Application No. 62/431,732 filed on Dec. 8, 2016 by Douglas Eckhart entitled "Column Grip" the contents of which are hereby incorporated by reference.

FIELD OF INVENTION

The present invention is a column grip, a device that can support or attach objects by friction grip to smooth surfaces, particularly columns on a railing system. Such objects include planters, flags, lights, electronic equipment, vases, sprinkler hoses, or decorations. Furthermore, the invention may utilize one or more mounting face, shelf, insert, hook, or accessory, which attach to a cam assembly for a variety of outdoor or indoor applications. For example, Halloween pumpkin can be displayed on a shelf that attaches to a cam assembly, attached to deck columns. Lights may also be attached to the cam assembly to not only improve the aesthetic appeal of a deck, but also illuminate surrounding areas and enhance safety.

BACKGROUND OF INVENTION

On a deck, tops of railing or floor are the only locations available for plants, tools, lights, electronic equipment, or decorations. These locations create safety concerns. Because of their intrusive nature, people often bump items, such as plants, off a deck railing. Likewise, objects on the floor are inadvertently kicked or tripped, resulting in injury. Additional injuries may incur during clean-up, because broken pottery pots made of porcelain have sharp edges.

In homes, plants or ornaments are often placed on floors or stairs, which can be kicked, creating a tripping hazard. For homes with small children, keeping objects off the floor is paramount. Sports enthusiasts and active children usually own many trophies. Finding a central location to properly display one's achievement is important. When the mantel is full, trophies are left on a table and blended with clutter. A parent must then struggle with the purchase of an expensive display case, only to be placed against a wall, when a more visible and central location is a main stairway.

Lighting placed around the deck, stairs, or hallway railing is needed for pedestrian safety, particularly for visiting guests getting accustom to new floor plans. Ornaments and flags improve the aesthetic appeal of a home and display the core values of a family within it. A way to mount insect repellant to protect from mosquitos which may carry pathogens (e.g., West Nile virus, Zika virus) is essential and most effective when placed around the entire perimeters of a deck. These are the many concerns the invention solves.

Existing patents do not address the above-mentioned concerns. Known devices related to deck fasteners has been patented. For example, U.S. Pat. No. 9,127,698 issued to Brulle et al. describes an anchoring device that secures items to support a structure having openings, such as narrow space between boards on a deck or patio. To install the device, the user threads a fastener through a holding plate between boards, then pulls a fastener upward to sandwich a base plate on two opposing sides of deck floor boards. However, this device is not suited for fastening objects between deck rails, which are spaced further apart than floor boards. Furthermore, the diameter of the anchoring device's outer surface is not adjustable to accommodate variations in deck railing spacing.

Other patents related to deck fasteners serve a different purpose, namely the construction of decks. For example, U.S. Pat. No. 6,053,280 issued to Smith et al. teaches a way to hang an upright leg to a deck for the purpose of supporting soffits, fascia, trusses, and other assemblies near the upper portion of walls. U.S. Pat. No. 8,011,148 issued to Bertke et al. teaches an interlocking decking system for the installation of deck flooring, walkway, or a platform. It facilitates the assembly of modular components, including free floating piers, deck pads, and blocks. U.S. Pat. No. 8,117,798 issued to Bergman describes a way to secure a post to a concrete foundation.

Some patents teach the use of wedges and cams to hang objects, but their application is directed to a non-analogous field of art, solving very different problems, namely mountain climbing. U.S. Pat. No. 3,948,485 issued to Chouinard et al. describes an irregular, polygonal mountaineering chock with opposing faces angled to fit between cracks in mountains. U.S. Pat. No. 4,082,241 teaches the use of pyramid shaped wedge as a more versatile chock to fit in between cracks in mountains.

In 1980, U.S. Pat. No. 4,184,657 issued to Jardine teaches the use of cam technology to lock a climbing aid into a mountain side. Thereafter, numerous patents in the non-analogous field of mountain climbing were issued, as provided in this non-exhaustive list: U.S. Pat. No. 4,491,291 issued to Ching; U.S. Pat. No. 4,565,342 issued to Grow; U.S. Pat. No. 4,712,754 issued to Brodie; U.S. Pat. No. 4,832,289 issued to Waggoner, U.S. Pat. No. 5,860,629 issued to Reed; U.S. Pat. No. 6,679,466 issued to Brown; U.S. Pat. No. 7,959,119 issued to Tusting et al.; and U.S. Pat. No. 8,317,145 issued to Reed. Generally, these patents teach ways to enhance the support of a bar or stem from cam movement from shock forces created by falling mountain climbers. The improvements include variation in cam numbers, spindle numbers, translatable axles, and flexible stems to compensate cam rotation during a person's free fall accident. The problems faced by mountain climbers are starkly different from the problems solved by this present invention. For example, how to hang objects on a column that is relatively smoother, and without the aid of a rope to support objects. Furthermore, the unilateral goal of supporting a mountain climber limits the solution, when the focus is adaptability, when displaying a broad range of objects.

A host of wall fasteners also exist, which include the use of pins, rivets, hooks, and bag fasteners. U.S. Pat. No. 3,650,173 issued to Mathe describes a slidable pin and plug member to spread a boss outward. U.S. Pat. No. 3,891,172 issued to Einhorn describes a two-part hook system with one hook extending into the wall and the second hook extending into the panel. The second hook is a cam that rotates and locks into the panel. U.S. Pat. No. 3,952,436 issued to Kuhnke teaches a fastener that adds an arm extending from the hook, which is nailed to a wall. The arm locks onto the picture frame with a fastener, securing the frame into a fixed position. U.S. Pat. No. 4,405,108 issued to Muirhead describes a magnetic tool retaining device. U.S. Pat. No. 4,531,697 issued to Steiner describes an apparatus for aperture boards. U.S. Pat. No. 4,610,587 issued to Wollar et al. describes a reusable two-piece fastener. Unlike a rivet with a smooth shaft, this invention utilizes a threaded screw to expand or retract the boss, which enables the body to be easily retracted from bore if needed. While it is applicable to hang picture frames to walls, it is more commonly seen to couple automotive panels or shielding together. U.S. Pat. No. 8,011,080 issued to Brown et al. teaches a hinged wall and ceiling anchor. These patents are distinguishable from the present invention by its mechanism and function. Specifically, these fasteners bore through a wall or peg board and utilize it as an anchor point, unlike the present invention that does not require boring through a surface to anchor or support the device.

Display racks have been patented to hang objects. However, the existing prior art differs from the present invention because its application is to store household objects. For example, U.S. Pat. No. 4,360,991 issued to West teaches a room dividing partition with a plurality of upright utility modules. It has a rigid structure and moves via tracks positioned along the floor. This device differs from the present invention, which hangs on columns and does not rely on tracks positioned along the floor. Other storage racks including U.S. Pat. No. 5,207,335 issued to Voelz rely upon a rotatable carousel conveyor that mounts on a turner unit to display objects. In contrast, the present invention does not rely upon a carousel to hang or store objects.

A host of other hanging devices exist, including U.S. Pat. No. 4,681,232 issued to Du Corday and U.S. Pat. No. 5,680,938 issued to Rubinstein. These devices are used to support periodicals, books, or binders. These applications differ from the present invention by utilizing an elongated member to support hangers, which suspends the periodicals, books, or binders.

Display devices supported by a frame have been patented: U.S. Pat. No. 5,899,343 issued to Franklin et al. is a jewelry display device; U.S. Pat. No. 6,484,893 issued to Tkatch is a shelving apparatus; U.S. Pat. No. 7,204,372 issued to Kin et al. is a rug display system, and U.S. Pat. No. 8,439,211 is a visual organization and display apparatus and system. These patents similarly rely on hangers or brackets that mount to a frame or housing, which differs from the present invention that mounts to columns affixed to deck railing or stair railing.

Furthermore, hanging devices such as an adjustable bar hanger and electrical box described in U.S. Pat. No. 8,967,585 issued to Gretz is used to mount heavy device such as an electrical fan to a ceiling by fitting between two rafters or similar supports. U.S. Pat. No. 9,010,550 issued to Figueroa is a tool bar to secure tools under a hood of a car during repair or maintenance by hooks that engage the edge of the hood. The mechanism of action differs from the present invention.

While many hanging or supporting devices exist, none is directed to hanging objects in between columns, typically attached to decks, hallway, or stairway railings. Additional advantage of the present invention is its portability, because it does not rely upon a bulky frame as a support system. Instead, this invention utilizes unique cam assembly designs, which are easily removable and portable, to support objects in between columns.

BRIEF DESCRIPTION OF THE INVENTION

The embodiments are illustrated by way of examples, and not by way of limitations, in figures of the accompanying drawings. While the claims distinctly point out the present invention, the following drawings and description taken in conjunction will aid in the understanding of the invention:

FIG. 5 is a front view of the column grip in an open configuration.

FIG. 6 is a front view of the column grip in a closed configuration.

FIG. 7 is a sectional view of the embodiment illustrated in FIG. 5.

FIG. 8 is a sectional view of the embodiment illustrated in FIG. 6.

FIG. 22 is a perspective view of two embodiments each with a panel and shelf assembly, supported by a bolt attached to a cam assembly.

FIG. 23 is a side view of the embodiments in FIG. 22.

FIG. 24 is a perspective view of a panel and shelf assembly supporting a pumpkin.

FIG. 25 is a front view of the embodiment in FIG. 24.

DETAILED DESCRIPTION OF THE INVENTION

The invention relates to fasteners that hang objects to columns, typically found along decks, stairway, or hallways. The column grip is a device that is an arrangement of a cam assembly, interchangeable accessories, or combination thereof, which secures such objects for display or connectivity. the objective of the invention is more readily apparent to those skilled in the art after review of the following description and FIGS. 1-84. The exemplary embodiments are provided to illustrate the invention and should not be construed as limiting the scope of the invention.

Figure 1:
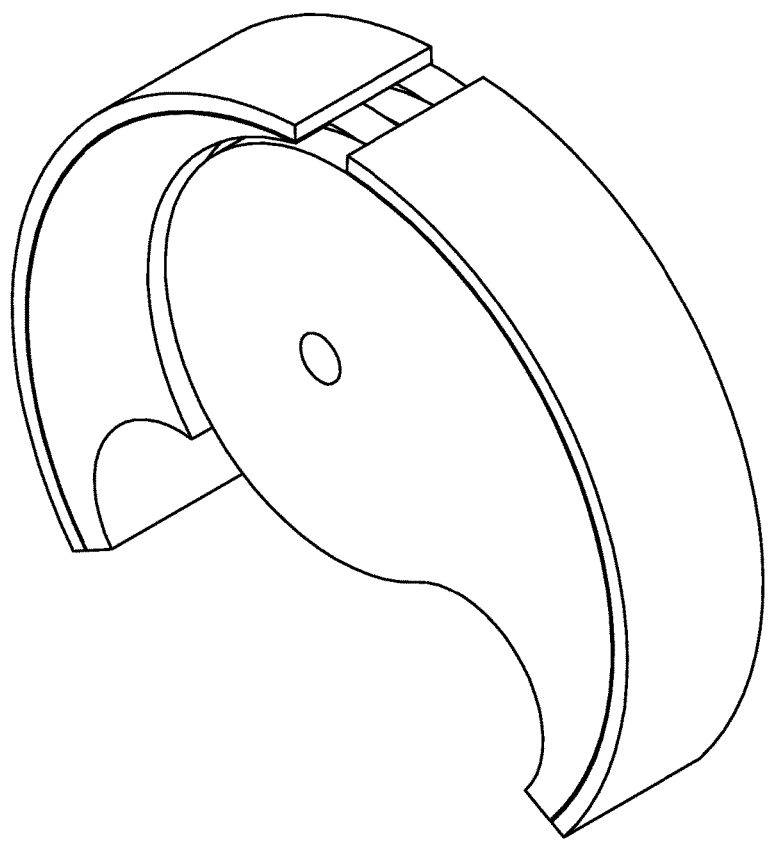
FIG. 1 is a perspective view of a column grip with shading to illustrate slip resistant material attached to its outer surface.

FIG. 1 illustrates an embodiment of the invention called column grip. This perspective view exemplifies the device as two comma-shaped cams joined together to form a circular or elliptical shape device called a cam assembly 20. The movable cams pivot about a main axis 12 where a bolt implements cam actuation. The outer surface of the cam assembly is slip resistant. This embodiment has slip resistant material, such as rubber padding, attached to the outer surface of each cam to increase its friction coefficient further. The scope of the column grip invention is not limited to the cam assembly alone, but also encompasses a cam assembly connected to accessories. A broad range of accessories may be combined with the cam assembly and still fall within the scope of the column grip invention. An attainment of the advantages and various operations of accessories comprising the invention are deliberated and illustrated in the following descriptions and drawings.

Figure 2:
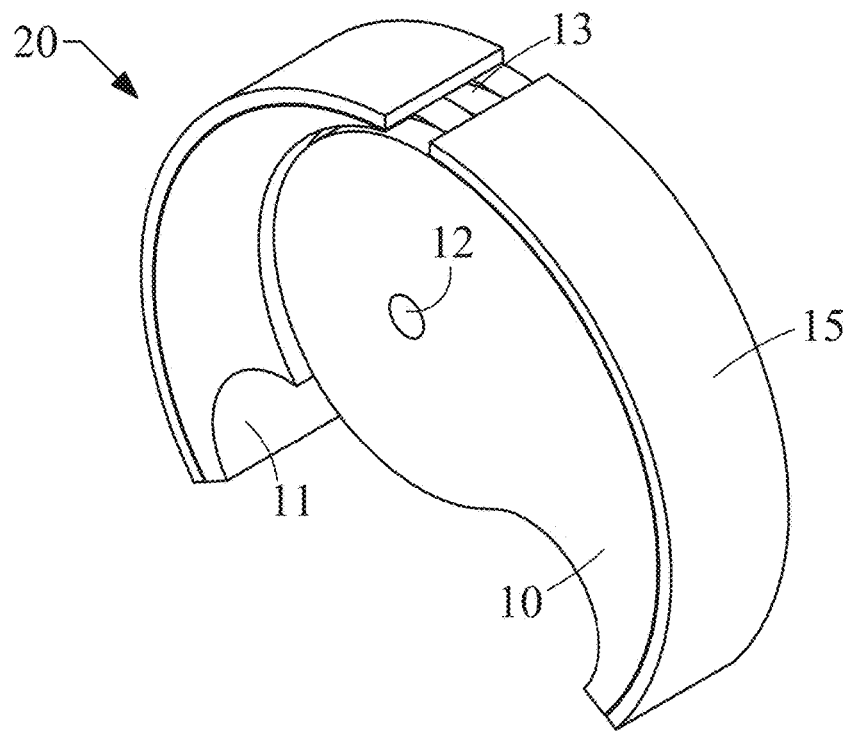
FIG. 2 is a perspective view of a cam assembly.
Figure 3:
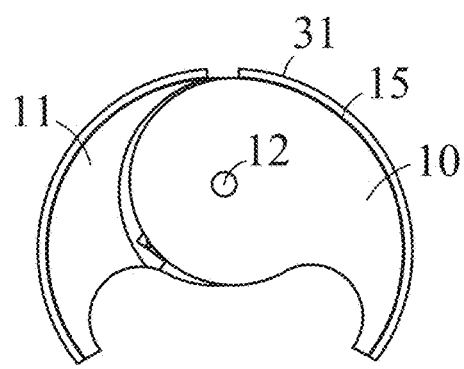
FIG. 3 is a front view of the embodiment illustrated in FIG. 2.
Figure 4:
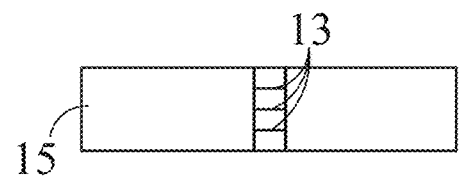
FIG. 4 is a top view of the embodiment illustrated in FIG. 2.

FIG. 2 is a perspective view of a cam assembly 20 residing in an open configuration for the purpose of wedging between columns of railing 27. FIG. 3 illustrates the main axis 12 where a first cam and a second cam pivot between open and closed configurations. A top view of the embodiment as seen in FIG. 4 shows overlapping surfaces 13 of first cam and second cam to maintain lateral alignment. The overlapping surfaces 13 slides with low friction resistance about the main axis 12.

FIGS. 5 and 6 illustrate a range of movement about the embodiment's main axis 12. FIG. 5 is a front view of the cam assembly in an open configuration. These drawings depict a hole that transverses the entire length of the main axis 12, through the front and back side of the cams. The hole may receive a bolt, shaft, threaded rod, or pin, which allows the cams to oscillate at angular motions, between open and close configurations. FIG. 6 is a front view of the invention with the cam in a close configuration, so the width between the outer surfaces of the cam is reduced to fit the invention between columns 28 of railing 27. The installation process may begin by placing the outer surfaces of the embodiment between columns 28, before its maximum operating angle is achieved.

The maximum operating angle is achieved, when a first cam outer tips 16 and a second cam outer tip 17 measured distance apart is greatest along their respective traveled path around the main axis 12. This operation is achieved, when rotation of the inner surface of the first cam 24 makes interference contact with a second cam inner surface 23, impeding further actuation. The minimum operating angle is achieved, when the first cam inner tips 18 and the second cam inner tip 19 make interference contact impeding further actuation as shown in FIG. 6.

FIG. 7 is a front sectional view of the invention, which demonstrates the presence of a compression spring 21 secured inside a spring housing 22. An indentation 25 on the inner surface of first cam 10 and corresponding indentation 25 on the inner surface of second cam 11 collectively forms a spring compartment 22. The compression spring 21 is one of the driving forces that expands the cam assembly 20 to an open configuration; consequently, anchoring the embodiment to opposing deck columns 28. The spring 21 may freely expand or contract within the space created by the spring housing 25.

In addition to the driving force by the spring 21, a downward force exerted by objects held or supported by the embodiment adds to the expansion of the cam assembly. The embodiment actuates toward its maximum operating angle, pushing its outer surfaces harder against opposing columns 28 supporting the cam assembly. The expansion force increases proportionately as the weight of an object increases, adapting the cam assembly to carry a heavier load when needed. The redistribution of downward forces as expansion forces against opposing columns 28, further increases its friction against opposing columns 28, adding to the mechanical advantage.

FIG. 8 is a front sectional view of the invention with a spring 21 in a compressed, storing mechanical energy. While in a close configuration, the opposing beak of each cam makes contact, rendering the cam assembly 20 in a fully closed position. There is no requirement to fully close the cam assembly during each installation. A partial closure may be sufficient to fit the cam assembly between two columns 28. Having a wide angular range of motion enhances the invention's utility by accommodating narrowly or broadly spaced columns 28.

Figure 9:
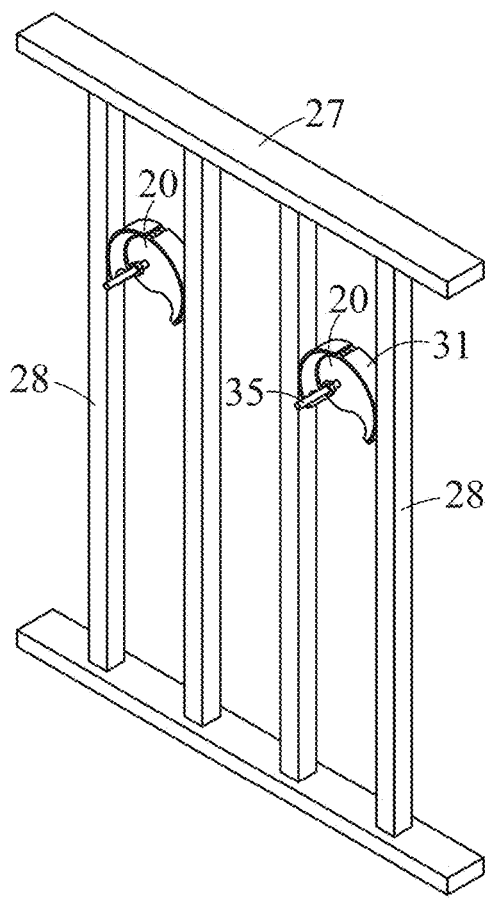
FIG. 9 is a perspective view of two embodiments mounted to rectangular shaped columns attached to deck columns.
Figure 10:
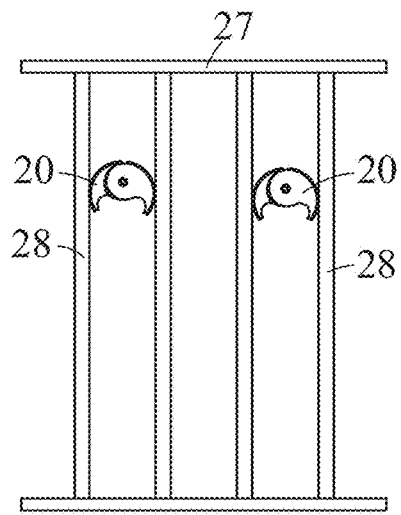
FIG. 10 is a front view of the embodiments illustrated in FIG. 9.
Figure 11:
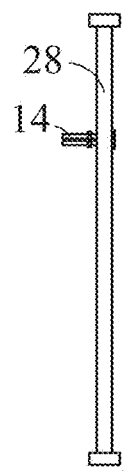
FIG. 11 is a side view of the embodiments illustrated in FIG. 9.

As depicted in FIG. 9, the compression spring 21 within the embodiment provides sufficient force to affix the device to rectangular shaped columns 28 of a railing 27. Here, FIG. 2, FIG. 3, and FIG. 9 are perspective views of the cam assembly with flat outer surface 31. FIG. 10 shows a front view of two embodiments horizontally aligned relative to the deck railing 27. Its narrow profile is illustrated in FIG. 11 via a side view. A shaft or bolt 35 used to pivot the cams around the main axis 12 is visible. Drawings displayed in later figures shows the shaft or bolt 35 supporting a panel 40, shelf 45, accessories, or combination thereof, for the purpose of holding a variety of objects. A fastener, such as a nut 36, is threaded around a bolt 35 to apply tension to objects held by the bolt 35. Additional spacer or washer may be used to add distance and enhance the free rotation of the cams.

Figure 12:
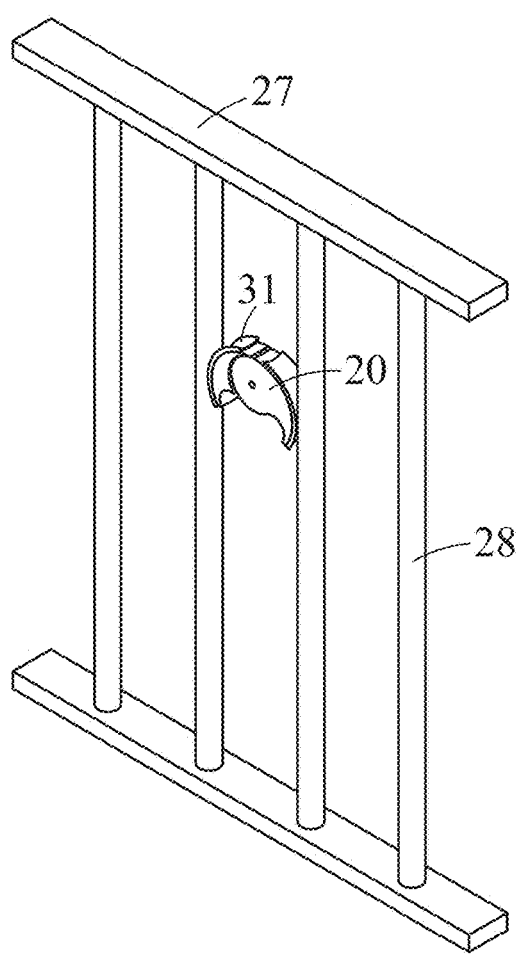
FIG. 12 is a perspective view of an embodiment attached to round columns.
Figure 13:
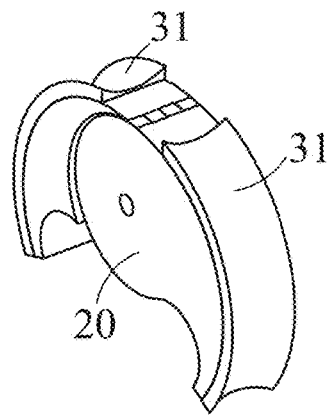
FIG. 13 illustrates curved outer surfaces of the embodiment in FIG. 12.
Figure 14:
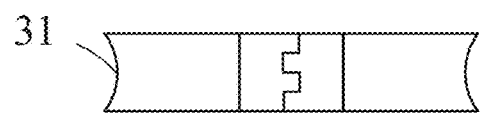
FIG. 14 is a top view of the curved outer surface of the embodiment.

FIG. 12 is a perspective view of the cam assembly 20 with rounded outer surfaces 31 for attachment to rounded columns 28. FIG. 13 is an enlarged perspective view of the invention. FIG. 14 is a top view of the invention further illustrating the rounded outer surfaces 31 of the cam assembly 20. The curve radius is customizable to various curve radius of any column 28. While these drawings demonstrate the invention conforming to square or rounded columns 28, other preferred embodiments with different shaped outer surfaces 31 are within the scope of this invention. For example, the outer surfaces may be shaped triangular, rectangular, pentagon, hexagon, or free form. In other preferred embodiments, the cam outer surface 31 conforms to irregular shapes typically found in wrought iron decorative railing 27.

Figure 15:
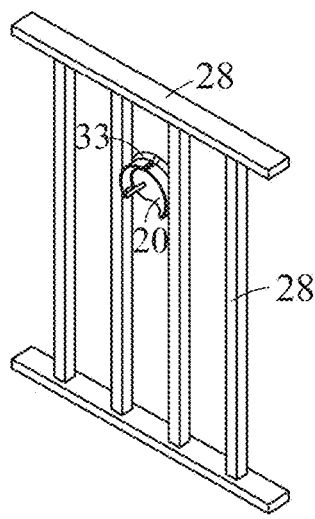
FIG. 15 is a perspective view of another embodiment.
Figure 16:
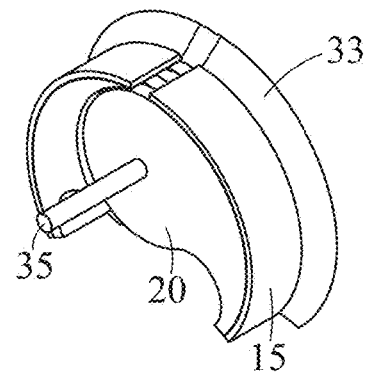
FIG. 16 is a magnified view of FIG. 15 to illustrate a bevel.
Figure 17:
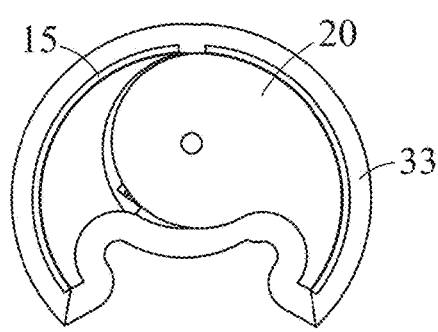
FIG. 17 is a front view of the embodiment illustrated in FIG. 16.
Figure 18:
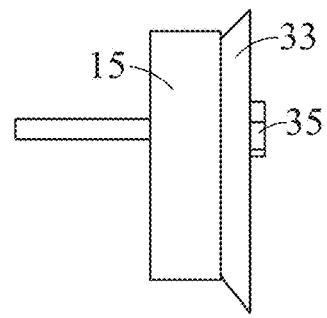
FIG. 18 is a side view, illustrating a bolt transversing a hole in the cam assembly.
Figure 19:
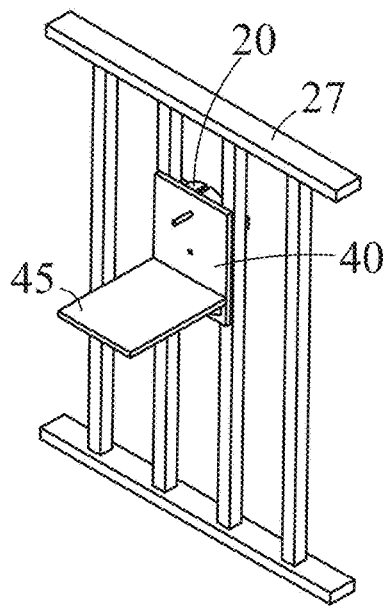
FIG. 19 is a front perspective view of an embodiment supporting a panel and shelf assembly.
Figure 20:
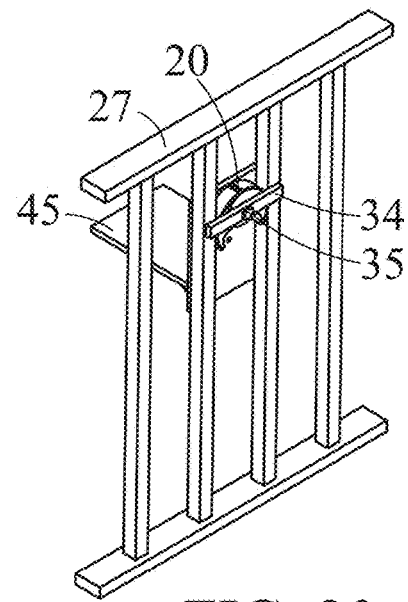
FIG. 20 is a rear perspective view of the embodiment in FIG. 19 bolted to a bar.
Figure 21:
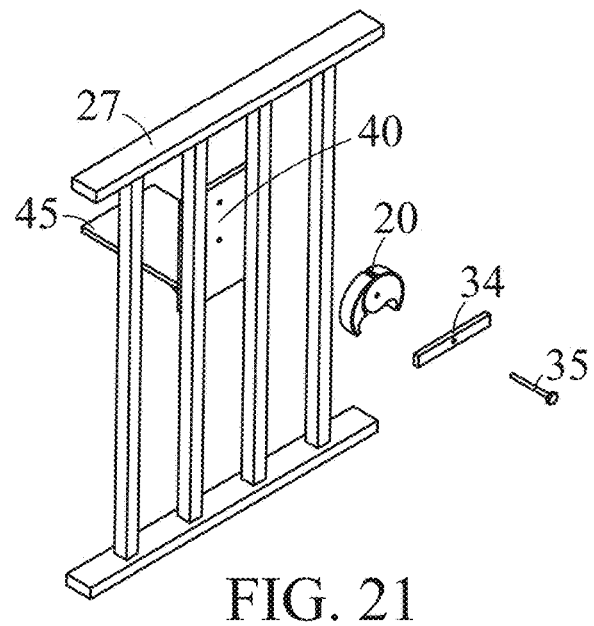
FIG. 21 is an exploded view of FIG. 20.
Figure 26:
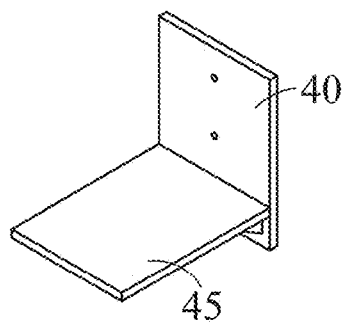
FIG. 26 is a perspective view of a panel and shelf assembly.

FIGS. 15 and 16 are perspective views of the cam assembly 20 with a bevel 33, which increases support or stability as the embodiment bears an object's weight. When a downward force is exerted on the bolt 35, directly or indirectly, the invention may tip forward. The bevel 33 counteracts the downward force or forward rotation by bracing the invention to the back or back edges of the columns 28. FIGS. 19 to 21 exemplify an alternative to an attachment of a bevel 33, namely an attachment of a bar 34 to counteract forward rotation forces created by the weight of objects pivoting a cam assembly 20 about its points of contact with columns 28. Through an exploded view, FIG. 21 illustrates a bolt securing a bar 34 to a cam assembly 20 and panel 40.

In FIG. 24, a Halloween pumpkin 47 is exerting a downward force indirectly by resting on a shelf 45, which is attached to panel 40 that is mounted to the bolt 35 fastened by a nut 36. In FIG. 25, the panel hole 41 receiving a bolt 35 is clearly visible just above the pumpkin 47. The panel hole 41 is useful to attach a cam assembly as shown in FIG. 22.

Figure 42:
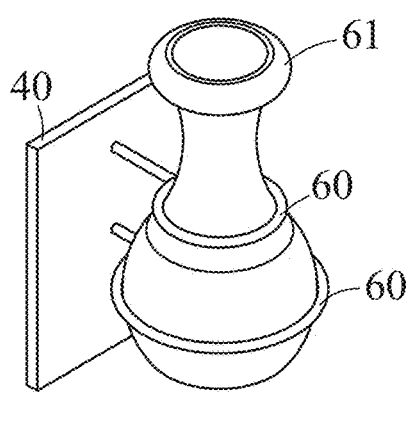
FIG. 42 illustrates a panel with a plurality of holder rings, which secures a vase into position.
Figure 43:
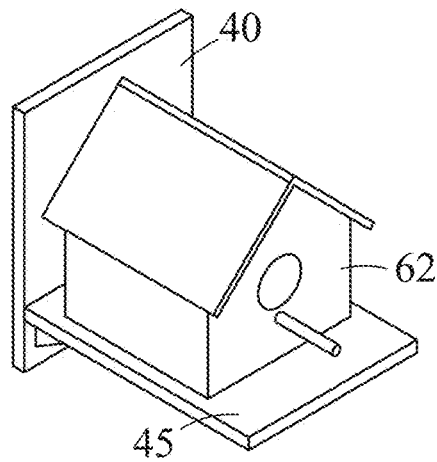
FIG. 43 illustrates a panel and shelf assembly, supporting a bird house.

While FIG. 24 describes the cam assembly with an ornamental Halloween pumpkin 47 placed on a shelf 45 attached to a panel 40, the shelf 45 may also support one or more flower pot, light, insect repellant, tool, electronic equipment, decoration, backyard object, household item, trophy, etc. For example, in FIG. 42, the panel hole 41 is used to attach a plurality of holder ring 60. In FIG. 43, the panel hole 41 is used to secure a bird house 62.

Figure 28:
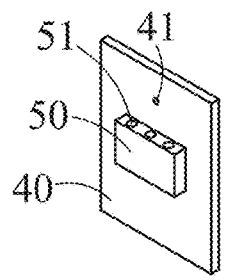
FIG. 28 is a perspective view of a mounting face attached to a panel.
Figure 29:
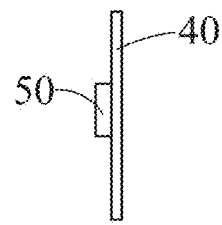
FIG. 29 is a side view of a mounting face attached to a panel.

Objects such as a mounting face 50 increase the embodiment's range of utility. In FIG. 28, mounting face 50 may attach to a panel 40 by adhesive, screws, bolts, or other fasteners. Here, a mounting face 50 has a plurality of slots 51, bored or drilled, which receive cylindrical objects, including flower stems, incense, or supporting structures (e.g., hooks, pegs, screws, shafts, inserts). In a preferred embodiment, the slots 51 are tapered to facilitate receipt of objects. In other embodiments, the shape, dimension, and number of the slots 51 vary to accommodate a broad range of backyard or household applications. For example, a rectangular slot 51 is cut into the mounting face 50 to hold a cellular phone.

Figure 30:
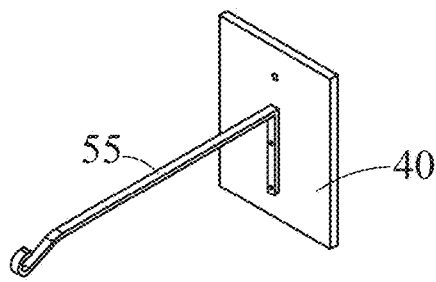
FIG. 30 is a perspective view of a hook fastened to a panel.
Figure 31:
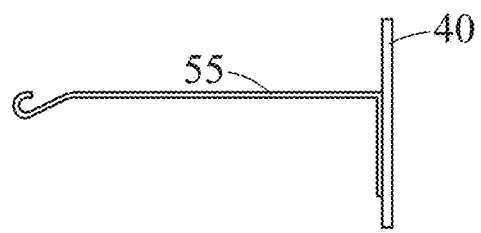
FIG. 31 is a side view of a hook fastened to a panel.

FIG. 30 describes a hook attached directly to a panel 40, without a mounting face 50 attached. FIG. 31 is a side view of a hook attached to a panel 40. The hook may support one or more flower pots, clothes, Christmas lights, or other items.

Figure 32:
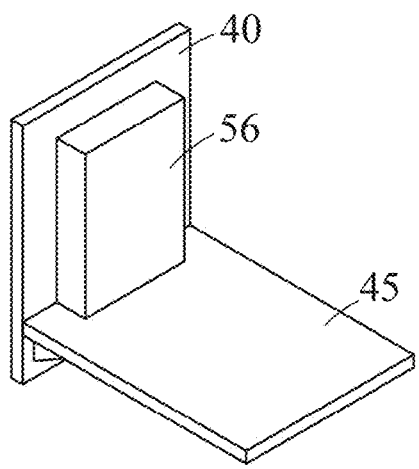
FIG. 32 illustrates a removable cover encapsulating a mounting face, which is attached to a panel.
Figure 35:
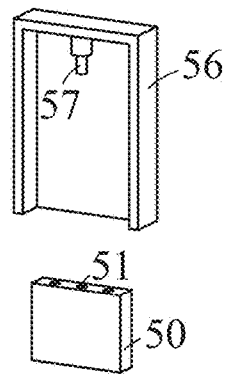
FIG. 35 is a rear perspective view of a removable cover that is elevated above the mounting face shown in FIG. 34.

FIGS. 32 and 35 demonstrate a mounting face 50 attached to a panel 40. FIG. 32 exemplifies a removable cover 56 encapsulating the mounting face 50 to protect it from damage, including wear and tear caused by exposure to weather conditions. The removable cover 56 has an outer section and inner section. In a preferred embodiment, the outer section is a ½-inch-thick plastic sheet with dimensions 6×9 inches. The inner section is also a ½ inch think sheet, but with a 5×8 inches cavity, which houses a ¼-inch steel cover rod 57 about 1-inch long. The cover rod 57 may insert into one of the slots 51 of the mounting face 50. In other preferred embodiments, the dimensions and material vary to accommodate the load supported by the shelf 45. The cover 56 also functions as a spacer 58 between the panel 40 and object resting on the shelf 45.

Figure 33:
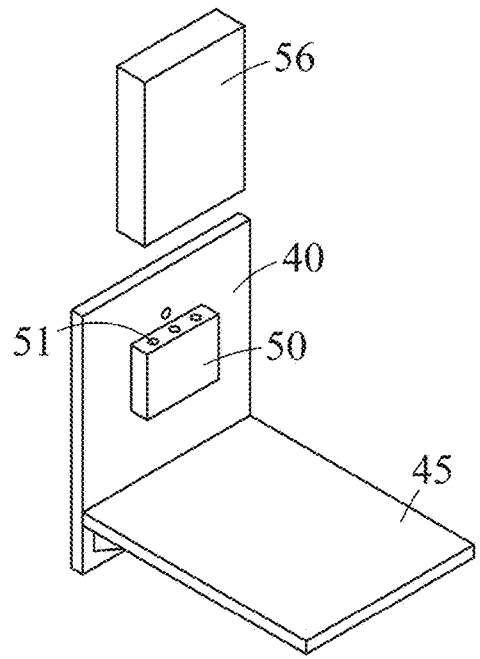
FIG. 33 illustrates a removable cover that is detached from the mounting face presented in FIG. 32.
Figure 34:
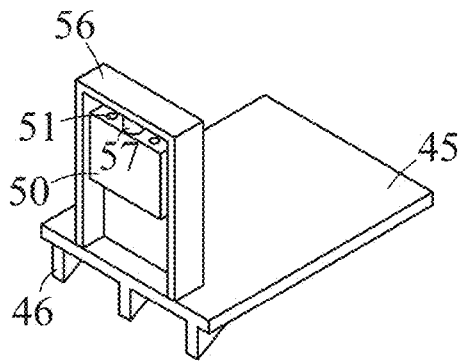
FIG. 34 illustrates a cover rod affixed to a removable cover and inserted into a center slot of a mounting face slot.

FIG. 33 exemplifies the cover 56 in a detached configuration, elevated about 10 inches above the mounting face 50. In contrast, FIG. 34 is a rear perspective view of the cover 56 secured to the mounting face 50 through an insertion of a cover rod 57 inserted into the center slot 51 of the mounting face 50. FIG. 35 is another rear perspective view of the cover 56 and mounting face 50, but in a detached configuration, so a cover rod 57 being inserted into the slot 51 is more visible.

More durable versions of the cam assembly, mounting face, and accessories are created with rust-resistant material, which include plastics such as PVC or metals such as steel. Other material including composites, alloys, weather resistant coatings, or other like material known in the art, also provides protection for the device or components.

Figure 36:
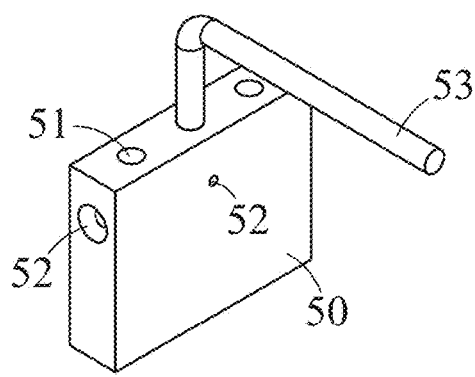
FIG. 36 illustrates a side wall of a mounting face with a pin hole, which receives a pin to hold a rod in position.

In FIG. 36, a mounting face 50 has a ¼-inch steel shaft 53 inserted into a slot 51 on the center axis of the mounting face 50. The shaft or other objects being inserted into the mounting face 50 can be made of other suitable types of metals. Plastic, composites, or wood are also effective materials, particular because of their rust resistant characteristics.

Figure 37:
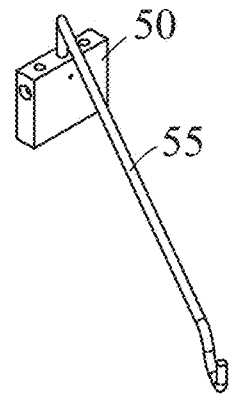
FIG. 37 illustrates a hook angled 45 degrees and affixed by a screw.

FIG. 37 describes a front wall and side wall of a mounting face 50 drilled, then tapped or threaded to form set screw holes 52 that receive screws or pins to fix the position of the shaft 53. Other locking mechanisms, including plungers, dowels, and pins are also effective ways to fix the shaft's position.

Figure 38:
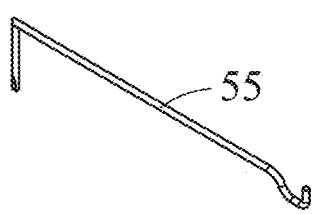
FIG. 38 illustrates a straight hook that attaches to a mounting face.

FIG. 38 shows a hook 55 with a straight arm inserted into the mounting face 50 with the hook 55 angled 45 degrees relative to the front mounting face 50, then fixed in position with a set screw. The hook 55 is mounted to allow any plant to be hung from deck columns 28 facing either toward or away from one's home. Multiple hooks 55 can be inserted into the mounting face 50, limited only by the maximum number of slots 51 drilled into the mounting face 50.

Figure 39:
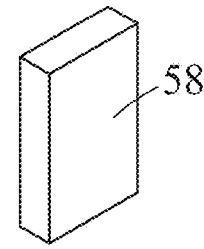
FIG. 39 illustrates a spacer that attaches to a mounting face.
Figure 40:
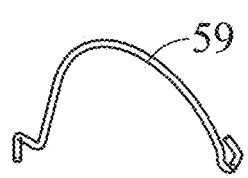
FIG. 40 illustrates a curved hook that attaches to a mounting face.

FIGS. 38 to 41 exemplify other conceived accessories that can insert into one or more of the slots 51 of the mounting face 50. FIG. 38 exemplifies another version of a plant hook 55 with a longer arm. FIG. 39 illustrates is a spacer 58. FIG. 40 shows a curved hook 59 resembling a goose-neck arm. The curved hook 59 may simultaneously attach to the mounting face 50 to hang objects such as a bird feeder.

Figure 41:
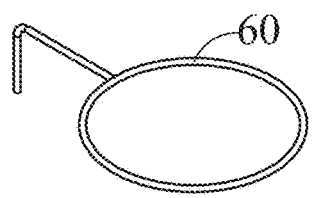
FIG. 41 illustrates a holder ring that attaches to a mounting face.

A holder ring 60, as shown in FIG. 41, allows plants to be hung from deck columns 28, likewise facing either toward or away from one's home. It has multiple diameters to allow a user to hang plants or flower pots with different diameters. Multiple plant holder rings 60 can also be used on the mounting face 50. Alternatively, as shown in FIG. 42, two holder rings 60 protrude from a panel 40 to secure a vase 61, ensuring that it remains in a desired position during harsh conditions.

Figure 44:
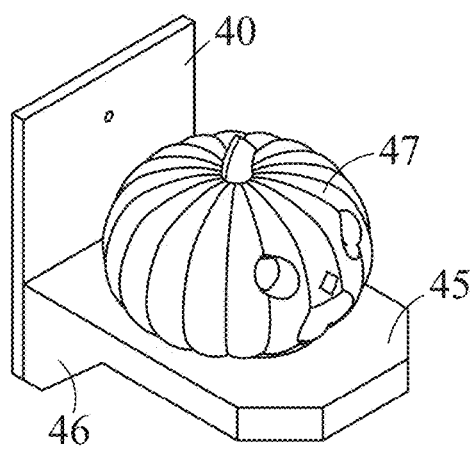
FIG. 44 illustrates a panel and shelf assembly with a more robust shelf support, displaying a decoration.
Figure 45:
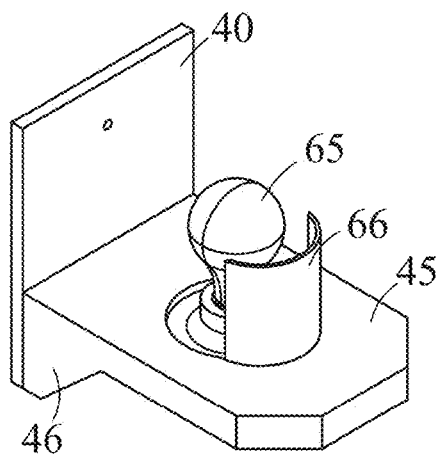
FIG. 45 illustrates a panel and shelf assembly in conjunction with a light bulb assembly.

Other accessories, such as a bird house 62 may attached to a shelf 45 platform. FIGS. 44 and 45 are perspective views of a pumpkin shelf accessory, comprising a pumpkin 47, shelf 45, and panel 40. The pumpkin shelf accessory is designed to act as a rail mounted shelf 45 to hold a Jack-o-lantern. Different size shelves 45 offer a range of sizes to accommodate natural variations in pumpkin 47 sizes. There are two designs: (1) light assembly 65 above a shelf 45 (inside the Jack-o-lantern), or (2) a light recessed below a shelf 45 (light projected into the Jack-o-lantern). A hole is cut beneath the pumpkin 47 to receive a light bulb or LED, which rests inside the Jack-o-lantern.

In a preferred embodiment, the pumpkin shelf accessory has 5 parts: (1) panel 40, (2) shelf 45, (3) pumpkin 47, (4) light assembly 65, and (5) light dimming shield 66. The shelf 45 utilizes ½-inch-thick plastic sheets, ½-inch steel shafts, and one or more screws to secure the components. The light assembly 65 is either a recessed outdoor light or an exposed outdoor flood light assembly.

Figure 27:
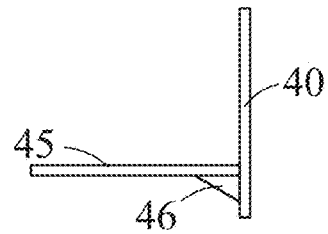
FIG. 27 is a side view of a panel and shelf assembly.

FIGS. 44 and 45 exemplify a more robust shelf support 46. In a preferred embodiment, the shelf 45 utilizes a ½-inch-thick plastic sheet and ½-inch steel shaft, then screws to secure the components of the assembly. In other preferred embodiments, the dimensions and materials vary to correspond to the weights of objects placed on the shelf 45. Triangular brackets beneath the shelf 45 increase the maximum load capacity of the shelf 45. FIGS. 25 and 27 provide a front and side view of separate triangular shelf support 46.

FIGS. 46 to 49 are drawings of a rail mounted shelf assembly, which utilize one or more rails to distribute and bear the load of objects place on a shelf 45. The rail mounted shelf assembly has 4 or more parts: (1) shelf 45, (2) rails 67, (3) mounting face 50, and panel 40. As an option, the rail mounted shelf assembly further includes a reinforcement plate 54 to added more support.

Figure 46:
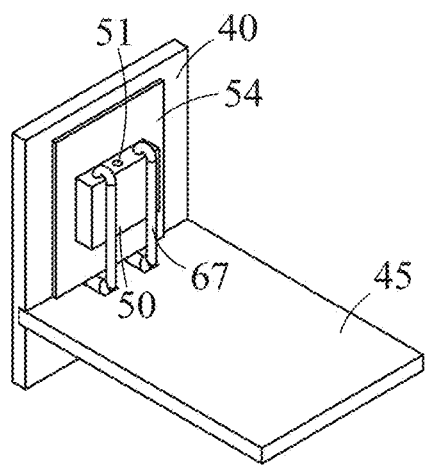
FIG. 46 is a rail mounted shelf assembly comprising a reinforcement plate, mounting face, two rails, and a shelf.
Figure 47:
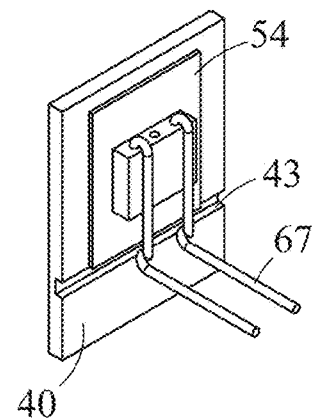
FIG. 47 is the embodiment in FIG. 43, but with the shelf hidden from view to illustrate two rails and a grove, which collectively support the shelf.
Figure 48:
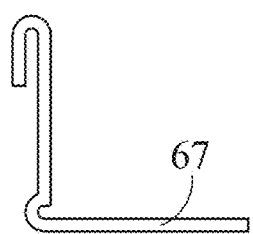
FIG. 48 is a side view of a rail illustrating its L-shaped configuration.
Figure 49:
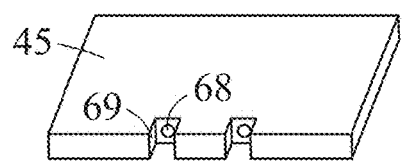
FIG. 49 illustrates a shelf with two notches and two shelf holes that receives the rails in FIG. 46.

FIG. 46 exemplifies a rail mounted shelf assembly, utilizing one end of a rail as a hook that inserts into a mounting face slot 51, and the other end inserting into a shelf hole 68. In a preferred embodiment, two or more rails are used to keep the shelf 45 level. In FIG. 47, the shelf 45 has been removed to explain the configuration of the rails, prior to the shelf 45 insertion. Larger diameter rails can bear the load of heavier objects placed on the shelf 45. FIG. 48 is a side view of the rail having an L-shaped configuration. FIG. 49 is a back view of the shelf 45, highlighting two notches 69 that allow clearance for the rails and enable the shelf 45 to rest flush against a grove 43 on the panel 40. Having two or more shelves on the same horizontal plane, but on different rails, give the user a longer shelf 45 surface, for example, to place a long planter.

Figure 50:
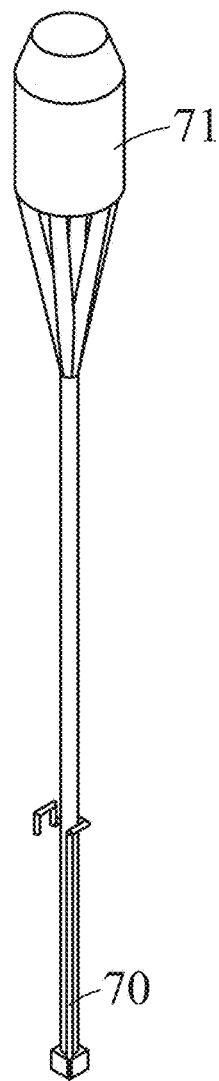
FIG. 50 is a perspective view of a torch holder accessory bearing a torch.
Figure 51:
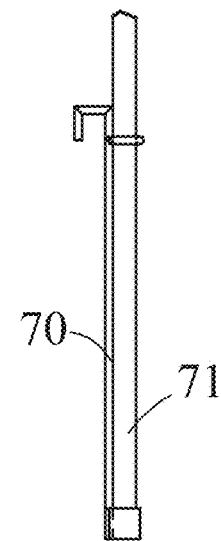
FIG. 51 is a side view of a torch holder accessory bearing a torch.
Figure 52:
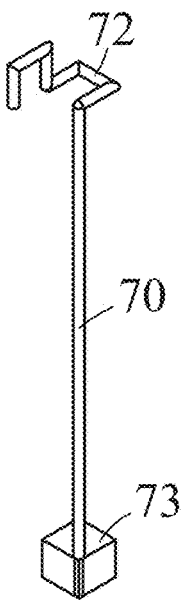
FIG. 52 is a magnified perspective view of the torch holder accessory in FIG. 50.
Figure 53:
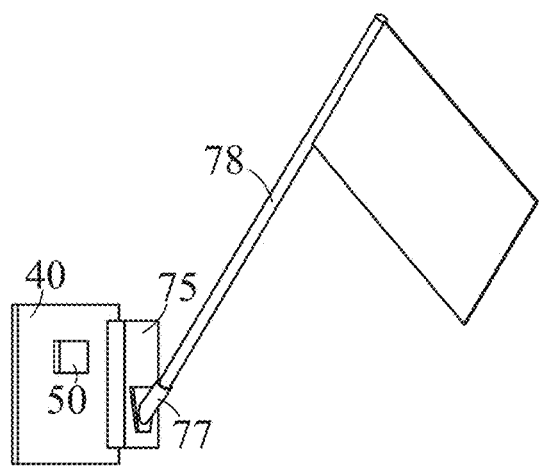
FIG. 53 illustrates a flag holder accessory detached from a mounting face.

FIGS. 50 to 52 exemplify a torch holder accessory, one of many accessories that attaches to the mounting face 50. The torch holder 70 is a tube frame and cup 73, having two points of connection: (1) an U-shaped loop 72 to allow the torch pole to pass through, and (2) a cup 73 for the bottom of the torch pole to stand in an upright configuration. FIG. 50 exemplifies a Tiki torch 71 resting on the torch holder 70. The Tiki torch holder 70 is made of steel or other suitable material including metal, metal alloy, plastic, composite, wood, or combination thereof.

FIGS. 53 to 56 depict a mountable flag holder accessory, which is strong enough to hold a 6-ft. flag 78 and stands up to medium level wind, but is also easy enough to remove or change height. This flag holder accessory is designed to be facing the outside of a deck. In this particular embodiment, the flag holder 77 utilizes ½-inch-thick plastic sheets and ¼-inch steel extrusion with a flag holder 77 mounted to a block 75.

Figure 54:
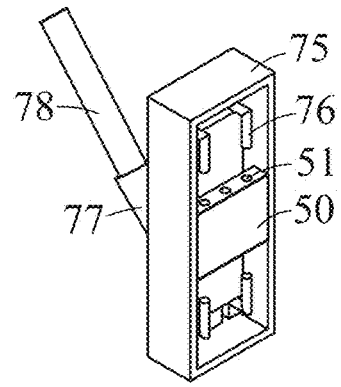
FIG. 54 is a rear perspective view of a block with a cavity that supports two extrusions aligned with the concentric axis of slots on a mounting face.
Figure 55:
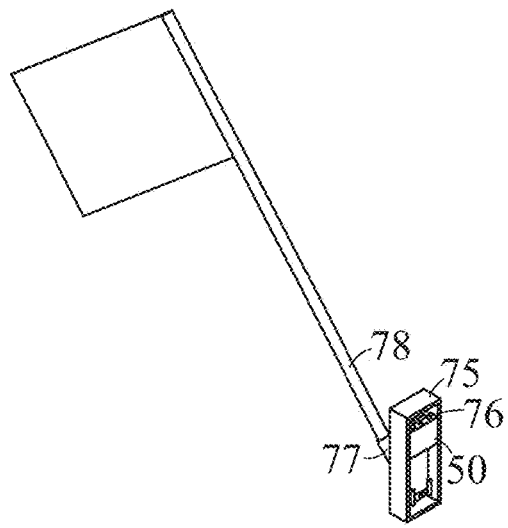
FIG. 55 illustrates a flag, flag holder, and block collectively called a flag holder accessory attached to a mounting face.
Figure 56:
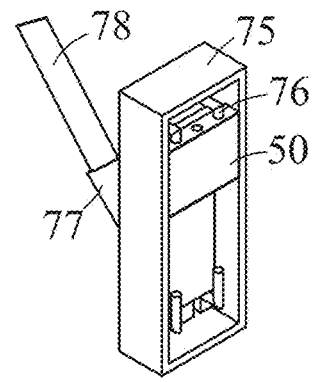
FIG. 56 is a magnified view of two extrusions inserted into slots of a mounting face.

FIG. 54 highlights a block 75 that has two extrusions 76 secured to its inside cavity, whereby the extrusion 76 inserts into the mounting face 50 to secure the block 75 into position. In a preferred embodiment, the block also houses a mounting face 50 when attached, enabling the block 75 back surface to butt against the panel 40. FIG. 54 exemplifies the block 75 detached from the mounting face 50, while FIG. 55 further exemplifies the block 75 attached to the mounting face 50. FIG. 56 is a magnified view of the attached configuration, highlighting two extrusions of the block 75 inserted into the mounting face slots 51.

Figure 57:
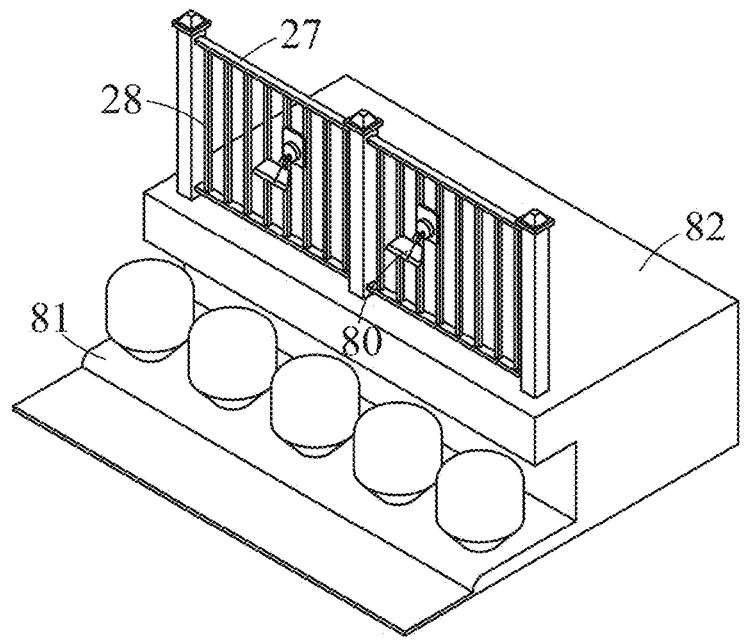
FIG. 57 is a perspective view of two flood light accessories attached to deck railings, shining on landscape.
Figure 58:
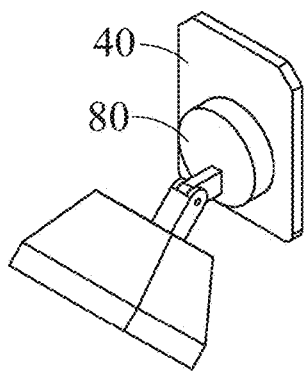
FIG. 58 is an enlarged view of a flood light accessory in FIG. 57.
Figure 59:
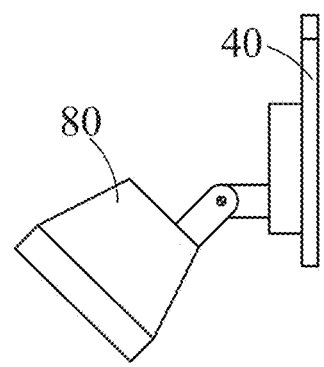
FIG. 59 is a side view of a flood light accessory in FIG. 57.

FIGS. 57 to 59 demonstrate a flood light accessory, which illuminate the outside areas of the deck 82. The flood light accessory is best used with higher decks 82 to illuminate a wider area around the deck 82. In a preferred embodiment, the components include a ½-inch plastic sheet, light assembly, and electrical cord, which are attached to a panel 40. FIG. 57 exemplifies two deck flood lights 80 attached to deck columns 28 that shines light at a downward angle toward landscape 81, such as bushes or lawn. The light source is LED or other low wattage bulbs. In a preferred embodiment, the flood light is motion triggered. The flood light 80 source of power is either battery or plug.

Figure 60:
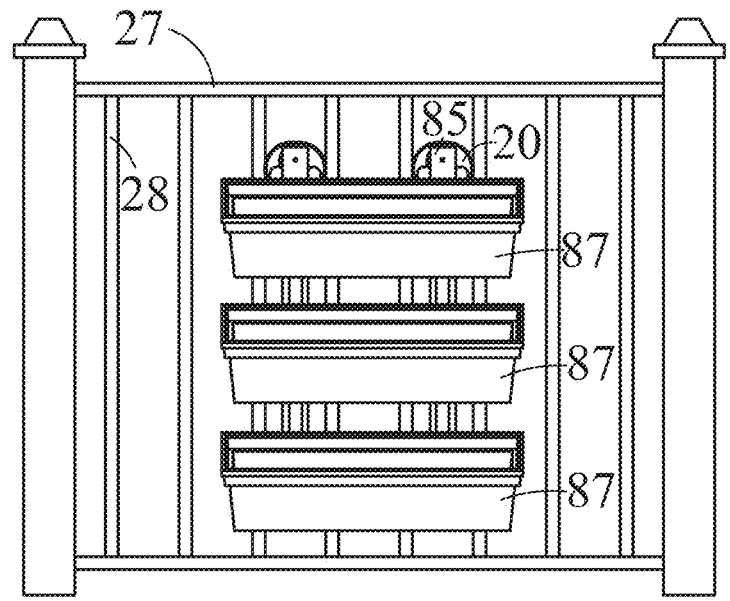
FIG. 60 is a front view of a garden accessory supported by two cam assemblies.
Figure 61:
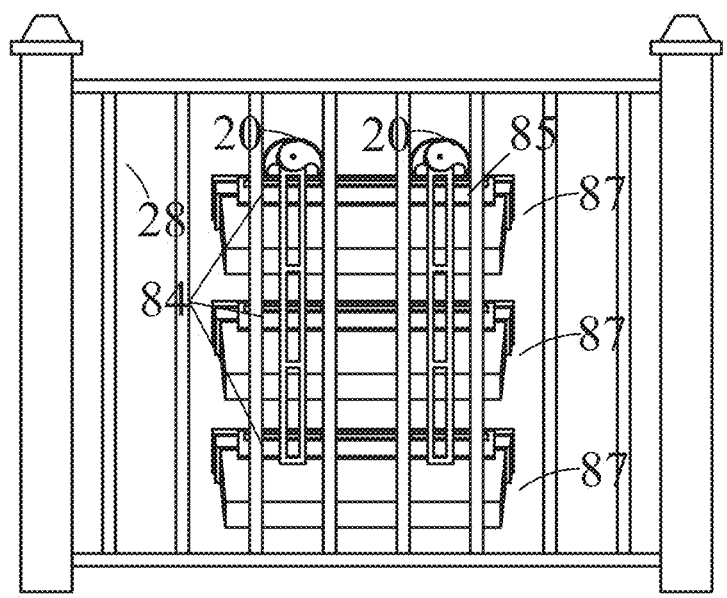
FIG. 61 is a rear view of the garden accessory in FIG. 60.
Figure 64:
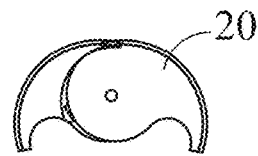
FIG. 64 is an enlarged view of the cam assembly in FIG. 62.
Figure 62:
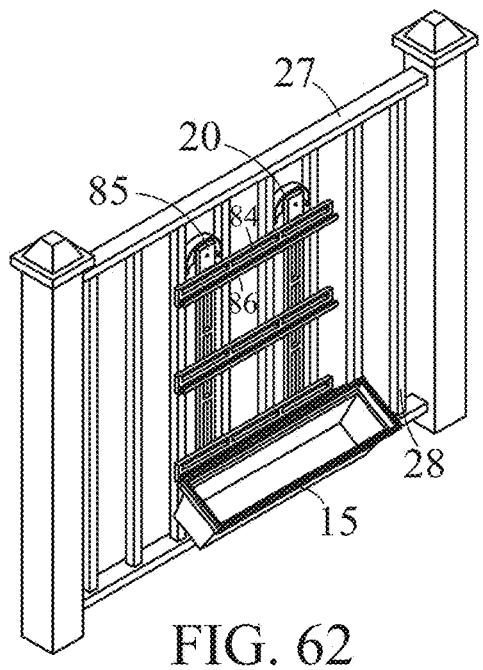
FIG. 62 illustrates mounting brackets that join a planter to garden columns.
Figure 65:
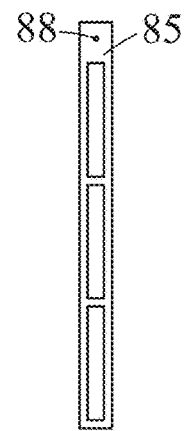
FIG. 65 is an enlarged view of a garden column in FIG. 62.
Figure 63:
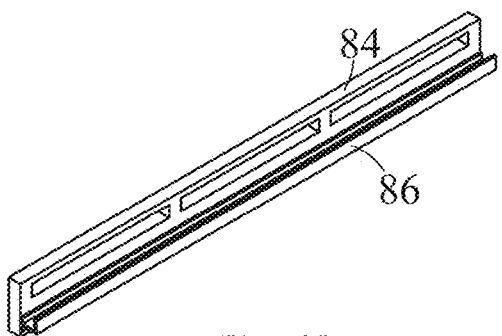
FIG. 63 is a magnification of the mounting bracket in FIG. 62.
Figure 66:
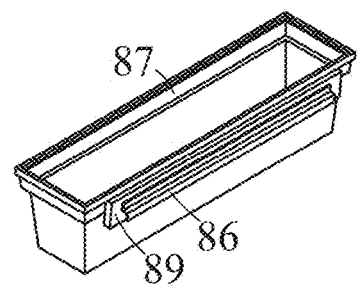
FIG. 66 is a rear perspective view of a planter having a planter bracket that hangs on the mounting bracket in FIG. 62.

FIGS. 60 to 66 describe a garden accessory, which is designed to be easily installed and changed planters 87. FIG. 60 is a front view of the garden accessory with three planters 87. FIG. 61 is a back view of the garden accessory with garden columns 85 running parallel to the deck columns 28. The mounting bracket 84 and planter bracket 89 both utilize a system of cleats 86 to enable the planter 87 to hang on the mounting bracket 84. The component of the garden accessory has been enlarged in the following drawings: FIG. 63 exemplifies a mounting bracket 84; FIG. 64 exemplifies a cam assembly 20; FIG. 65 exemplifies a garden column 85; and FIG. 66 exemplifies a planter 87. The support structure is made of metal or plastic, and completely adjustable. In a preferred embodiment, two or more embodiments are utilized to support the weights of the gardens inside the planters 87. For heavier gardens, use of additional cam assemblies 20 are suggested to improve stability and maximize load capacity. In a preferred embodiment, 1 to 4 planters 87 are attach to the mounting bracket 84. Planter angle is determined by the mounting bracket 84 or cleat 86 system. Planters are removable from the mounting bracket 84 to enable substitution or rotation of planters 87 hung on the mounting bracket 84, accommodating seasonal preferences or growth cycles of different plants.

The cam assembly 20 supports a mounting face 50 with a flat front surface to secure broad ranges of items, such as a thermometer, barometer, clock, router, satellite dish, wires, or decorations. The embodiment can also support a water sprinkler accessory, which allows a hose to attach to the back side of the panel 40, while a sprinkler or drip system attaches to the front. Ideally, the sprinkler accessory faces the area to be watered.

Figure 67:
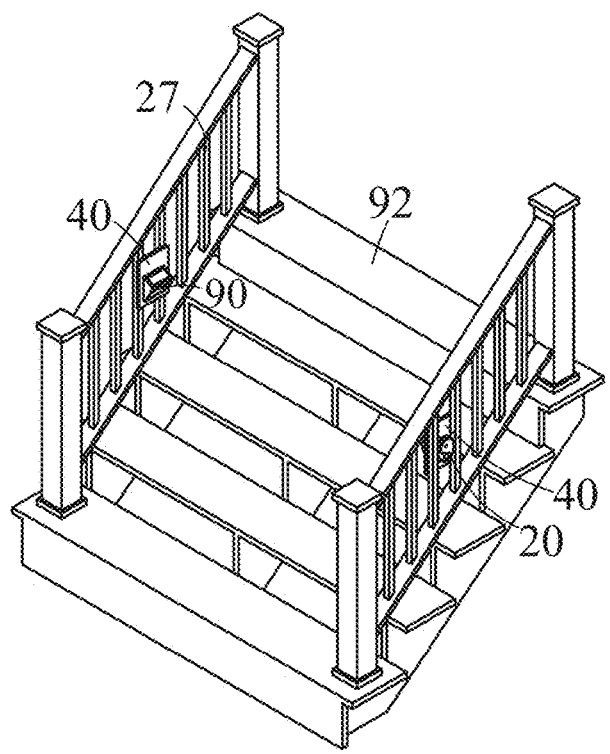
FIG. 67 is a perspective view of two deck light accessories attached to columns of a deck stairway by two cam accessories.
Figure 68:
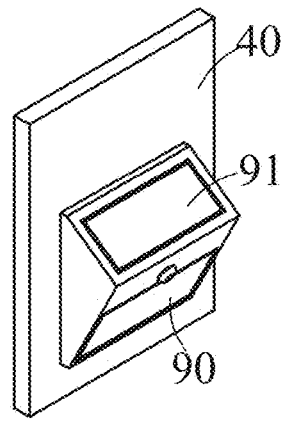
FIG. 68 is an enlarged view of a deck light accessory having a solar panel.
Figure 69:
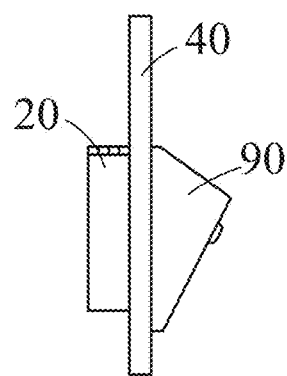
FIG. 69 illustrates a cam assembly mounted to a deck light accessory, comprising a deck light and panel.
Figure 70:
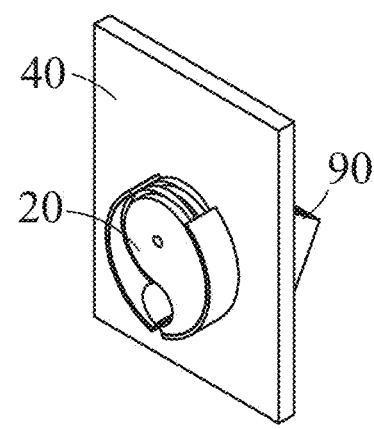
FIG. 70 is a rear perspective view of a cam assembly in a closed configuration with a deck lighting accessory mounted.

The cam assembly 20 can even support attachments such as a deck light accessory illustrated in FIGS. 67 to 70. The drawing in FIG. 67 shows an appreciable light source facing internally toward the deck 82 to illuminate stairs 92. In other preferred embodiments, the deck light 90 is positioned along several deck railings 27 to illuminate the deck floor and surrounding areas. FIGS. 68 and 69 exemplify the light angled downward to minimize hot spots or glare. The light source is LED or other low wattage bulb. In a preferred embodiment, the deck light 90 is motion triggered. The deck light power source includes battery or plug. FIG. 68 exemplifies a deck light 90 utilizing a solar power system, having a solar panel 91 on the top of the deck light 90. FIG. 70 exemplifies a cam assembly 20 attached to the back surface of a panel 40, enabling the deck light accessory to mount to deck columns 28.

Figure 71:
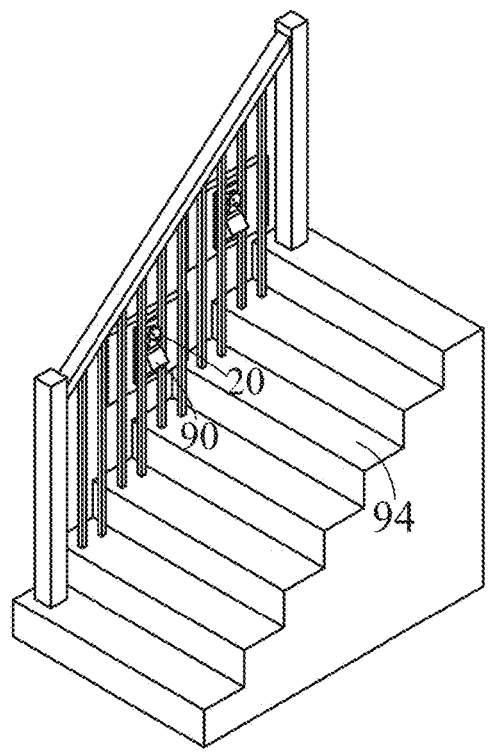
FIG. 71 illustrates two picture holder accessories mounted to a stairway inside a home by cam assemblies.
Figure 72:
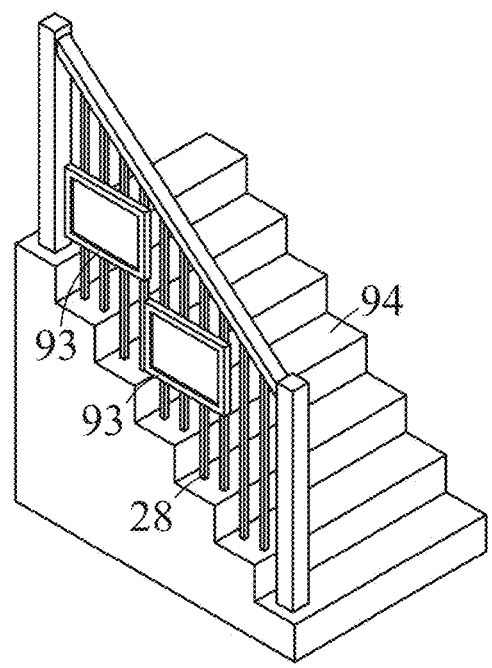
FIG. 72 is a front perspective view of two picture holder accessories.
Figure 73:
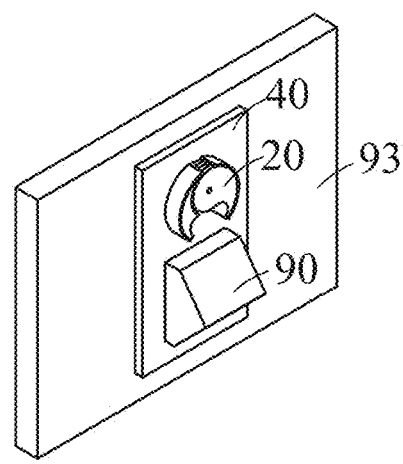
FIG. 73 illustrate a cam assembly mounted to a picture holder accessory comprising a picture frame, panel, and light source.
Figure 74:
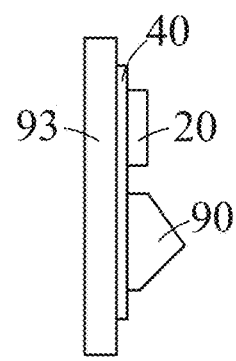
FIG. 74 is a side view of the embodiment in FIG. 73.
Figure 75:
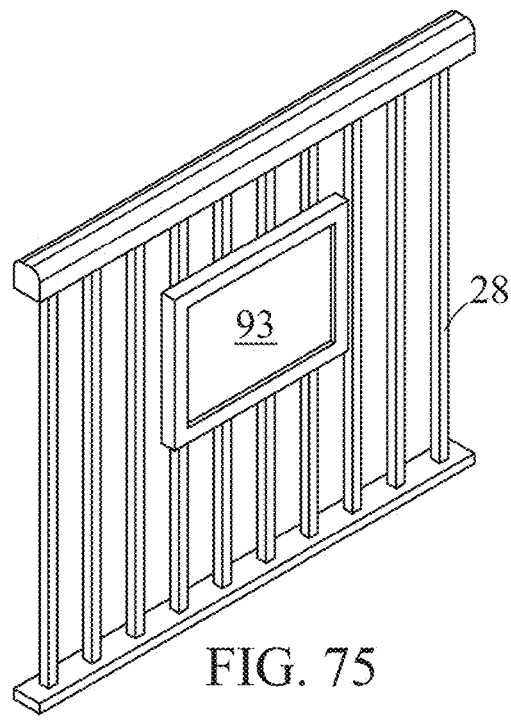
FIG. 75 illustrates a picture frame attached to hallway railing.
Figure 76:
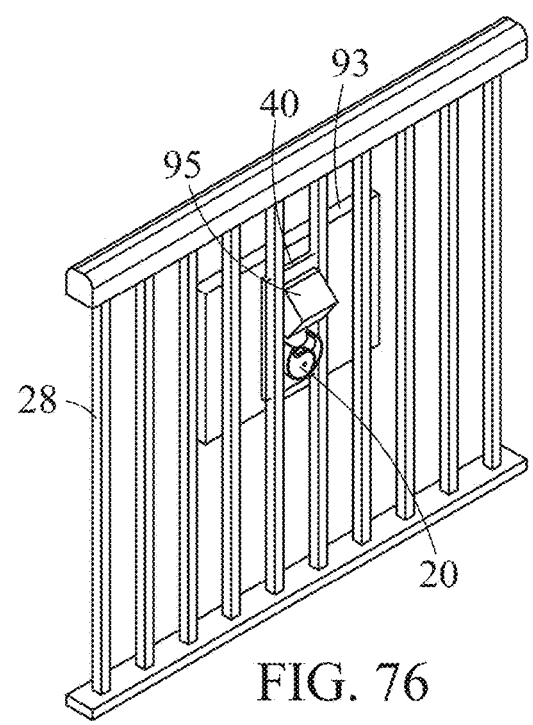
FIG. 76 is a rear perspective view of FIG. 75, illustrating an upside-down cam assembly and picture frame assembly attached to hallway railing.

FIGS. 71 to 76 exemplify a picture holder accessory. The picture frame 93 attaches to a panel 40 or directly to the cam assembly 20, which secures a painting to columns 28 of stair railing 27. FIGS. 71 and 72 exemplify the cam assembly 20 hanging a picture frame 93 to stair railings 27. FIGS. 75 and 76 exemplify the cam assembly 20 hanging a picture frame 93 to hallway railings 28. FIGS. 71, 73, 74, and 76 exemplify the addition of a light source 95 attached to the back surface of the panel 40. The purpose is to enhance the safety level for pedestrians walking in these locations.

Figure 77:
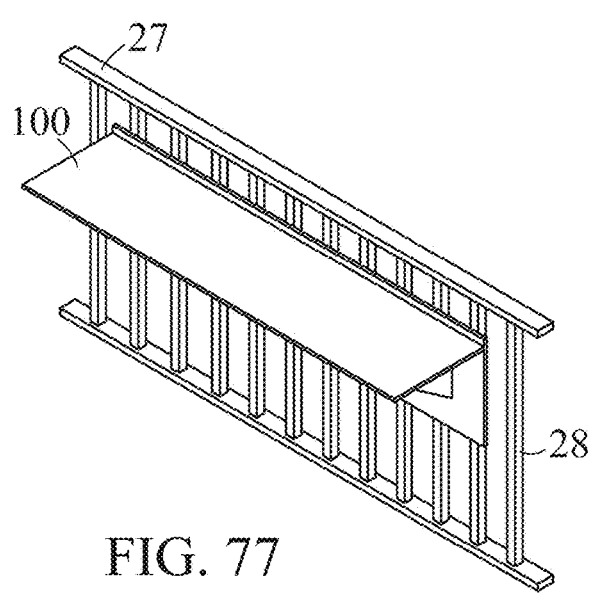
FIG. 77 is a front perspective view of a table accessory attached to columns.
Figure 78:
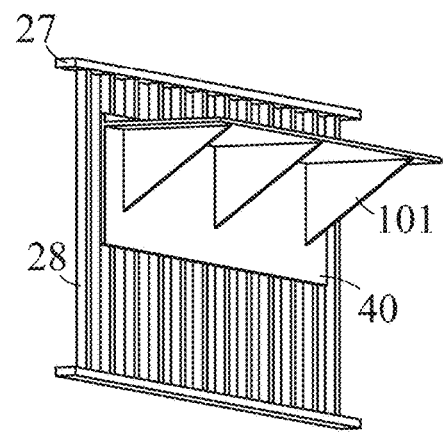
FIG. 78 is a side perspective view of a table accessory attached to columns.
Figure 79:
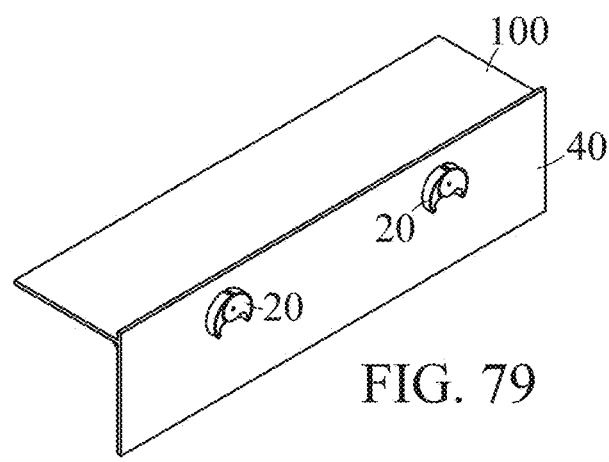
FIG. 79 is a back view of FIGS. 77 and 78 with the railing suppressed, illustrating two cam assemblies attached to the table accessory.

FIGS. 77 to 79 depicts a table accessory to increase the useful surface area of a deck. The table accessory has a top surface 100 attached to triangular supports 101 affixed to a panel 40. The table accessory is mounted to columns 28 by a plurality of cam assemblies 20 attached to the back surface of the panel 40.

Figure 80:
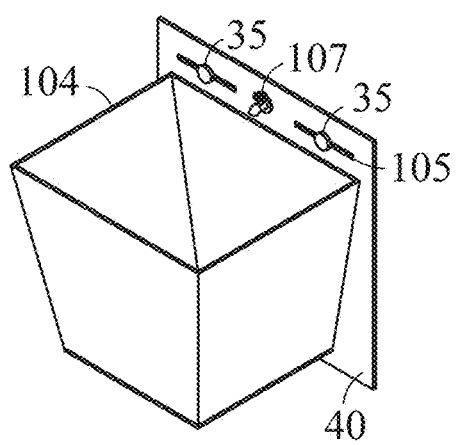
FIG. 80 is a front perspective view of a sink accessory.
Figure 81:
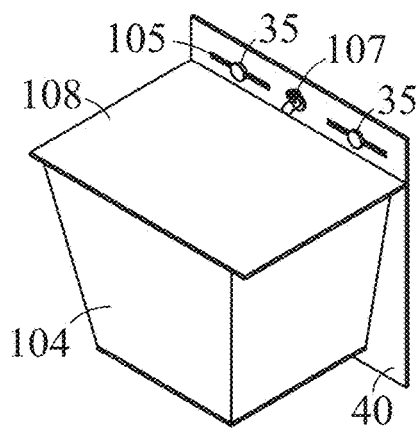
FIG. 81 is a front perspective view of a sink accessory with a cover.
Figure 82:
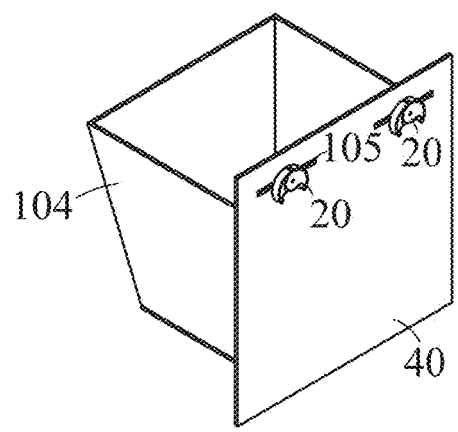
FIG. 82 is a back perspective view of a sink accessory illustrating two cam assemblies attached to the sink accessory.

FIGS. 80 to 82 exemplifies a sink accessory. Unlike most deck sinks, this sink 104 is portable, because its installation utilizes cam assemblies 40 as a support system, instead of masonry typically used to house a deck sink. The sink assembly has 3 elements: (1) sink 104. (2) faucet 107, and (3) panel 40. However, the sink assembly may include a $4^{th}$ element: a cover 108. The sink assembly has a panel 40 with slides 105, which receives bolts 35 that attach to one or more cam assemblies 20. The slide 105 aids in cam assembly 20 alignment between deck columns 28.

Figures 83, 84:
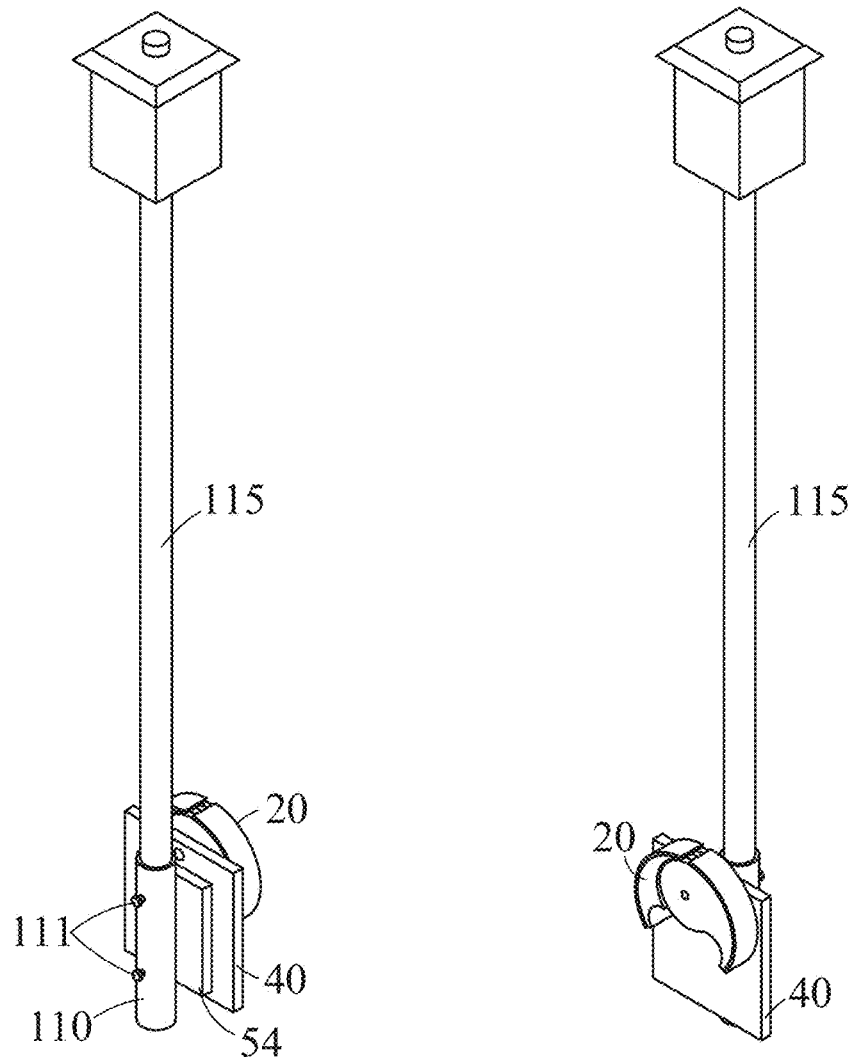
FIG. 83 is a front perspective view of a lamp accessory.
FIG. 84 is a back perspective view of a lamp accessory.

FIGS. 83 and 84 illustrates a lamp accessory, which as 4 elements: (1) base 110, (2) screws 111 (2) plate 54, (3) panel 40, and (4) lamp 115. A cam assembly 20 attaches to the back surface of a panel 54, which enables the lamp accessory to be affixed to deck columns.

The material used to create this invention may contain polymeric, composite, ceramic, wood, metal, plastic, rubber, or combination thereof. The invention encompasses all suitable materials known to a person of ordinary skills in the art, interchangeable with those designated in the drawings or written descriptions of this invention.

It is understood that the details are illustrative, such that additional changes or modifications may be made by one with ordinary skills in the art, and still fall within the scope of this invention.

I claim:
1. A column grip comprising:
 a) a first cam pivotally connected to a second cam about a main axis, forming a cam assembly, whereby actuation between an open configuration and a closed configuration enable the cam assembly to be inserted in between columns;
 b) the first cam and the second cam each has spring housing that contributes as end portions of a spring compartment, whereby a spring is secured inside the spring compartment to assert a force to expand the cam assembly to an open configuration;

c) a bar, which is attached to one side of the cam assembly, exerts pressure in a direction toward two adjacent columns; and, d) a panel, which is attached to the opposite side of the cam assembly, exerts pressure in the opposite direction, to sandwich the cam assembly between the two adjacent columns.

2. A column grip of claim 1, wherein the cam assembly is attached to a panel and shelf.

3. A column grip comprising:

a) a first cam pivotally connected to a second cam about a main axis, forming a cam assembly, whereby actuation between an open configuration and a closed configuration enable the cam assembly to be inserted in between columns;

b) the first cam and the second cams each has a spring housing that contributes as end portions of a spring compartment, whereby a spring is secured inside the spring compartment to assert a force to expand the cam assembly to an open configuration;

c) a bar, which is attached to one side of the cam assembly, exerts pressure in a direction toward two adjacent columns;

d) a panel, which is attached to the opposite side of the cam assembly, exerts pressure in the opposite direction, to sandwich the cam assembly between the two adjacent columns; and, e) at least one accessory that attaches directly or indirectly to the cam assembly.

4. A column grip of claim 3, wherein the first cam and second cam have a flat or rounded outer surface that contours to shapes or curvatures of the columns.

5. A column grip of claim 3, wherein the cam assembly has one or more bevels that tapers toward the circumference of a cam, creating a wedge between the adjacent columns to increase support or stability of the cam assembly, when carrying a load.

6. A column grip of claim 3, wherein the cam assembly has an outer surface affixed with slip resistant material that has grit, treads or rubberized coating for traction between that cam assembly and the adjacent columns.

7. A column grip of claim 3, wherein the accessory is a panel, shelf, panel and shelf assembly, pumpkin shelf accessory, mounting face, cover, hook space, holder ring, flag holder accessory, torch holder accessory, rail mounted shelf assembly, light accessory, deck light, light source sprinkler accessory, flood light accessor, garden accessory, table accessory, sink accessory, or lamp accessory.

8. A column grip comprising:

a) a first cam pivotally connected to a second cam about a main axis forming a cam assembly, whereby actuation between an open configuration and a closed configuration enable the cam assembly to be inserted in between columns;

b) The first cam and the second cams each has a spring housing that contributes as end portions of a spring compartment, whereby a spring is secured inside the spring compartment to assert a force to expand the cam assembly to an open configuration;

c) a bar, which is attached to one side of the cam assembly, exerts pressure in a direction toward two adjacent columns;

d) a panel, which is attached to the opposite side of the cam assembly, exerts pressure in the opposite direction, to sandwich the cam assembly between the two adjacent columns; and, e) at least one accessory that attaches directly or indirectly to the cam assembly.

9. A column grip of claim 8, wherein the first cam and second cam have a flat or rounded outer surface that contours to shapes or curvatures of the columns.

10. A column grip of claim 8, wherein the cam assembly has one or more bevels that tapers toward the circumference of a cam, creating a wedge between the adjacent columns to increase support or stability of the cam assembly, when carrying a load.

11. A column grip of claim 8, wherein the cam assembly outer surface is made of or affixed with slip resistant material that has sandpaper grit, embedded treads or rubberized coating for traction between that cam assembly and the adjacent columns.

12. A column grip of claim 8, wherein the accessory is a panel, shelf, panel and shelf assembly, pumpkin shelf accessory, mounting face, cover, hook, spacer, holder ring, flag holder accessory, torch holder accessory, rail mounted shelf assembly, light accessory, deck light, light source, sprinkler accessory, flood light accessor, garden accessory, table accessory, sink accessory, or lamp accessory.

13. A column grip of claim 8, wherein the accessory is a panel that attaches to a mounting face with at least one slot capable of receiving at least one object, whereby said object is a cover, hook, space, holder ring, block, rod, extrusion, flag accessory, or torch holder accessory.

14. A column grip of claim 8, wherein the cam assembly is fastened to a panel with a mounting face having at least on slot, whereby at least one shelf rail inserts into said slot and a shelf hole.

15. A column grip of claim 8, wherein the cam assembly is fastened to a panel and shelf assembly to support at least one flower pots, lights, insect repellants, tools, phones, computers, electronic equipment, decorations, backyard or household items.

16. A column grip of claim 8, wherein the cam assembly is fastened to a flag holder accessory, wherein the cam assembly supports a panel with a mounting face having at least one slot, which receive a block with at least one extrusion, whereby a flag holder fastens to the block displays a flag.

17. A column grip of claim 8, wherein the cam assembly is fastened to a garden accessory, wherein a plurality of cam assembly supports a plurality of garden columns, that is attached to at least one mounting bracket, which further attaches to at least one planter.

18. A column grip of claim 8, wherein the cam assembly attaches to columns on deck railing, whereby a panel secured to the cam assembly supports a deck light that illuminates a deck, platform, stairway, walkway, landscape, or surface.

19. A column grip of claim 8, wherein the cam assembly is attached to a panel that simultaneously support a picture frame and light source to illuminate a stairway, hallway, floor, or surface.

20. A column grip of claim 8, wherein the cam assembly is attached to a table accessory, wherein the table accessory has a top surface, triangular supports, and a panel.

21. A column grip of claim 8, wherein the cam assembly is attached to a sink accessory, wherein the sink accessory has sink, faucet, and panel.

22. A column grip of claim 8, wherein the cam assembly is attached to a sink accessory, wherein the sink accessory has a sink, faucet, panel, and cover.

23. A column grip of claim 8, wherein the cam assembly is attached to a lamp accessory, wherein the lamp accessory has base, plate, panel, and lamp.

\* \* \* \* \*